United States Patent
Gleisberg et al.

(10) Patent No.: US 10,357,840 B2
(45) Date of Patent: Jul. 23, 2019

(54) METHOD FOR FORMING A BONDED JOINT

(71) Applicant: FEW Fahrzeugelektrik Werk GmbH & Co. KG, Zwenkau (DE)

(72) Inventors: Roy Gleisberg, Markranstädt (DE); Björn Schneider, Markkleeberg (DE); André Jenrich, Leipzig (DE)

(73) Assignee: FEW Fahrzeugelektrik Werk GmbH & Co. KG, Zwenkau (DE)

( * ) Notice: Subject to any disclaimer, the term of this patent is extended or adjusted under 35 U.S.C. 154(b) by 0 days.

(21) Appl. No.: 15/679,601

(22) Filed: Aug. 17, 2017

(65) Prior Publication Data

US 2018/0050404 A1    Feb. 22, 2018

(30) Foreign Application Priority Data

Aug. 18, 2016    (DE) .................. 10 2016 115 364

(51) Int. Cl.
*B23K 31/02*    (2006.01)
*B23K 1/00*     (2006.01)
(Continued)

(52) U.S. Cl.
CPC .............. *B23K 1/0006* (2013.01); *B23K 1/19* (2013.01); *B23K 35/001* (2013.01);
(Continued)

(58) Field of Classification Search
CPC ................... B23K 1/0006; B23K 35/0238; B23K 35/001; B23K 2103/54; B23K 2101/36; B23K 35/3033; B23K 23/00; C03C 27/04
(Continued)

(56) References Cited

U.S. PATENT DOCUMENTS 5,794,838 A * 8/1998 Ushikoshi ............. C04B 37/006
                                                    228/121
6,736,942 B2 * 5/2004 Weihs .................. B23K 1/0006
                                                    204/192.12
(Continued)

FOREIGN PATENT DOCUMENTS

DE      102011113523 A1 * 3/2013 ........... H02K 1/0212
DE      10 2012 007 804      8/2013 ............... B23K 1/00
DE      10 2015 003 086      3/2016 ............. B23K 1/002

*Primary Examiner* — Kiley S Stoner
(74) *Attorney, Agent, or Firm* — Bodner & O'Rourke, LLP; Gerald T. Bodner; Christian P. Bodner

(57) ABSTRACT

The invention relates to a method for forming a bonded joint between a structure that is applied to a glass substrate, in particular a printed conductive structure and an electrical connecting component, in particular a solder base by using solder coated or non-solder coated reactive nanometer multilayer foils which are made from at least two exothermally reacting materials. Initially preconfiguring the reactive nanometer multilayer foils according to the opposing joining surfaces of the conductive structure and the electrical closure element is performed. Thereafter arranging a solder preform respectively between the respective joining surface and the nanometer multilayer foil for non-solder coated foils or arranging an additional solder preform for already solder coated nanometer multilayer foils is performed, wherein the solder preform or the additional solder preform includes a larger, in particular double thickness layer compared to another solder preform between the nanometer multilayer foil and the a conductive structure applied to the glass substrate so that a reduction of the temperature introduction into the conductive structure and a leveling of uneven portions is caused. After temporarily applying a pressure force which is applied between the joining surfaces triggering the exothermal reaction of the nanometer multilayer foil is performed by an electrical impulse or a laser impulse.

8 Claims, 5 Drawing Sheets

(51) Int. Cl.
*B23K 35/00* (2006.01)
*B23K 35/02* (2006.01)
*C03C 27/04* (2006.01)
*B23K 1/19* (2006.01)
*B23K 101/36* (2006.01)
*B23K 103/00* (2006.01)
*B23K 35/30* (2006.01)
*B23K 101/38* (2006.01)
*B23K 103/16* (2006.01)

(52) U.S. Cl.
CPC .......... *B23K 35/0238* (2013.01); *C03C 27/04* (2013.01); *B23K 35/3033* (2013.01); *B23K 2101/36* (2018.08); *B23K 2101/38* (2018.08); *B23K 2103/172* (2018.08); *B23K 2103/54* (2018.08)

(58) Field of Classification Search
USPC ..... 228/121–124.7, 179.1–180.22, 245–246, 228/234.3
See application file for complete search history.

(56) References Cited

U.S. PATENT DOCUMENTS

| | | | | |
|---|---|---|---|---|
| 7,361,412 | B2* | 4/2008 | Wang | B23K 1/0006 428/686 |
| 2003/0164289 | A1* | 9/2003 | Weihs | B23K 1/0006 204/192.12 |
| 2005/0045700 | A1* | 3/2005 | Winter | B23K 35/02 228/246 |
| 2005/0082343 | A1* | 4/2005 | Wang | B23K 1/0006 228/115 |
| 2005/0121499 | A1* | 6/2005 | Heerden | B23K 1/0006 228/246 |
| 2005/0136270 | A1* | 6/2005 | Besnoin | B23K 1/0016 428/469 |
| 2007/0023489 | A1* | 2/2007 | Swiston, Jr. | B23K 1/0006 228/262.9 |
| 2007/0235500 | A1* | 10/2007 | Suh | B23K 1/0006 228/101 |
| 2008/0063889 | A1* | 3/2008 | Duckham | B23K 1/0006 428/615 |
| 2008/0299410 | A1* | 12/2008 | Duckham | B23K 1/0006 428/607 |
| 2009/0186195 | A1* | 7/2009 | Spraker | B23K 1/0006 428/172 |
| 2010/0175756 | A1* | 7/2010 | Weihs | B32B 37/1207 136/259 |
| 2011/0024416 | A1* | 2/2011 | Xun | B23K 20/16 220/200 |
| 2011/0089462 | A1* | 4/2011 | Van Heerden | H05K 3/341 257/99 |
| 2011/0132437 | A1* | 6/2011 | Kost | C03C 27/08 136/251 |
| 2013/0250538 | A1* | 9/2013 | Le | B23K 3/085 361/807 |
| 2014/0004389 | A1* | 1/2014 | Schaefer | H01M 10/4207 429/7 |
| 2014/0210110 | A1* | 7/2014 | Smith | H01L 24/32 257/779 |
| 2014/0353015 | A1* | 12/2014 | Hoepfner | H05K 1/181 174/255 |
| 2015/0028084 | A1 | 1/2015 | Jenrich | 228/122.1 |
| 2016/0121395 | A1* | 5/2016 | Kawanaka | C09K 5/16 428/642 |

* cited by examiner

METHOD FOR FORMING A BONDED JOINT

The invention relates to a method for forming a bonded joint between a conductive structure that is applied and in particular printed on a glass substrate and an electrical connection component, in particular a soldering base by using solder coated and non-solder coated nanometer multilayer foils which are made from at least two exothermally reacting materials according to the preamble of patent claim 1.

A method is known from DE 10 2015 003 086 A1 for process time reduction when soldering electrical or electronic components by electromagnetic induction heating. This method relates in particular to soldering electrical contact elements with solder connection surfaces wherein the electrical contact elements are applied to a non-metallic substrate, in particular a glass pane.

According to this solution an electrical contact element configured as a soldering base is provided which is made from a material based on an iron-nickel or iron-chromium alloy. Thereafter a lead free connecting material is applied to the soldering base. After positioning the soldering base on the respective solder connecting surface the soldering base is inductively heated by high frequency energy with increased heating of the soldering base material and reduced heating of the silver including material of the respective solder connecting surface. The soldering step is completed after a time of less than 10 seconds.

Also with this reduced process time the electrical connecting structure can be damaged, in particular when this connecting structure is a silver print on the glass pane so that a long term stability of these electrical contacts is problematic.

When performing the method for producing technologically optimized solder joints according to DE 10 2012 007 804 A1 lead free solder connections are performed wherein a least one of the joining parameters provides the solder required for the connection. In order to activate the solder a flux material is used. The electrical and the mechanical connection is implemented by a soldering process through heat development and melting of the solder-flux material mix including the subsequent cooling phase.

In order to reduce the stress on the joining partners the joining partners and the solder are heated in a first temperature treatment phase to a temperature below the activation temperature of the solder and the flux material. Thereafter another heating is performed in a second temperature treatment phase to a temperature above the activation temperature of the flux material into an upper portion of the melting range of the solder wherein the solder melts and starts to connect with the respective joining partners. Furthermore in order to accelerate adhesion properties of the joining partners an increase of the thermal power used so far is performed by another 5-30% in a third temperature treatment phase.

Though this technology of forming solder joints, in particular lead free solder joints facilitates a substantial improvement of the process parameters, this technology yields a significant stress of glass substrates used in the soldering process, in particular of glass substrates used in motor vehicles. This problem is aggravated by multiple coatings applied on the relevant contact side of the glass, which are for example provided as color layers or layers which are configured as reflection layers, for example with reference to infrared radiation.

Furthermore reactive nanometer multi layers are known. These are made from materials which release energy upon chemical bonding. Possible applications of these foils are recited in a publication by Indium Corporation under www.indium.com.

Thus, it is an object of the invention to provide an improved method for providing a bonded joint between a structure that is applied to a glass substrate and which is in particular a printed conductive structure and an electrical connecting element, in particular a soldering base.

In order to achieve the object of the invention solder coated or non-solder coated reactive nanometer multilayer foils are used, wherein the multilayer foils are made from at least two exothermally reactive materials.

The object of the invention is achieved by the method according to the teachings of claim 1, wherein the dependent claims include at least advantageous embodiments and improvements.

The method according to the invention for forming bonded joints between a printed conductive structure applied in particular on an automotive glass pane and of the electrical connecting components, for example solder bases is defined by the application of solder coated or non-solder coated reactive nanometer multilayer foils. The reactive nanometer multilayer foils are configured to trigger an exothermal reaction as a response to an ignition impulse so that a thermal energy for producing the bonded joint can be provided over a short time period.

The reactive nanometer multilayers are made from very thin individual layers wherein at least two materials are being used that react with each other in an exothermal manner.

When an activation energy, e.g. in the form of an electrical spark or laser impulse is introduced in a layer system of this type an atomic inter diffusion of the materials into each other occurs and a progressing self-sustaining exothermal reaction occurs.

As a consequence the entire reactive layer reacts in a very short time period and releases energy in a form of heat in a confined local area.

The reactive nanometer layer foils melt to provide clearly defined reaction systems and quasi custom designed heat sources can be provided for joining applications so that a heat load when using the respective foils can be kept rather low with reference to surrounding components or substrates.

According to the method according to the invention initially a pre configuration of the reactive nanometer multilayer foils is performed according to the opposing joining surfaces of the conductive structure on the one hand side and the electric joining component on the other hand side.

Thereafter a solder preform is implemented respectively between the respective joining surface and the nanometer multilayer foil when foils are not coated with solder or an arrangement of an opposite solder preform is implemented when the nanometer multilayer foils are already coated with solder, wherein the solder preform or the additional solder preform has a greater, in particular at least double layer thickness between the nanometer multilayer foil and the conductive structure applied to the glass substrate, compared to the additional solder preform so that a reduction of the temperature introduction into the conductive structure and a compensation of unevenness in a gap portion between the joining surfaces is caused.

Consequently a temporary pressing force is applied which becomes effective between the joining surfaces. Thereafter the exothermal reaction of the nanometer multilayer foil is triggered which can be done for example using a laser impulse or an electrical short circuit causing sparks.

In order to introduce the ignition impulse into the nanometer multilayer foil a recess in the surface of the electrical connecting component is provided.

As a supplement or alternatively the nanometer multilayer foil can be configured so that it protrudes at least over a side of the joining surface in order to introduce the ignition impulse into the nanometer multilayer foil.

The overall thickness of the nanometer multilayer foil is scaled with respect to the volume of thermal energy to be released as a function of properties of the conductive structure and its base in order to avoid a thermal overload in particular of the base or of the conductive structure.

At least portions of components of the reactive nanometer multilayer foil are applied directly onto at least one of the joining surfaces in particular the joining surface of the electrical connecting component. This can be performed by a deposition process, in particular a sputter process.

The invention is subsequently described in more detail with reference to an embodiment and drawing figures.

Figure 1:
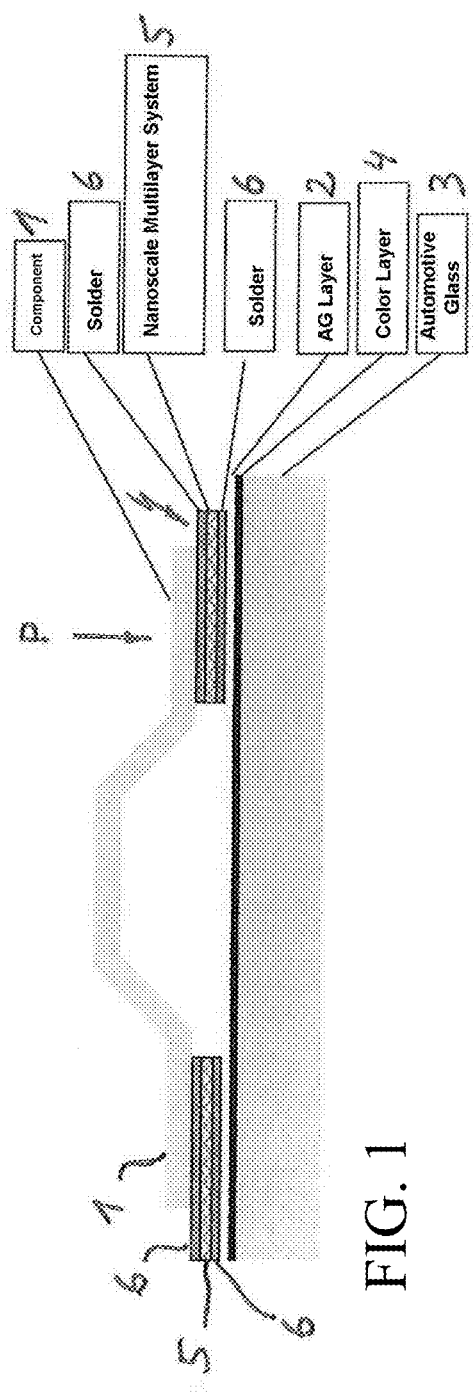
FIG. 1 illustrates a sectional view of a schematic configuration of a joint using nanometer multilayer foils.
Figure 2:
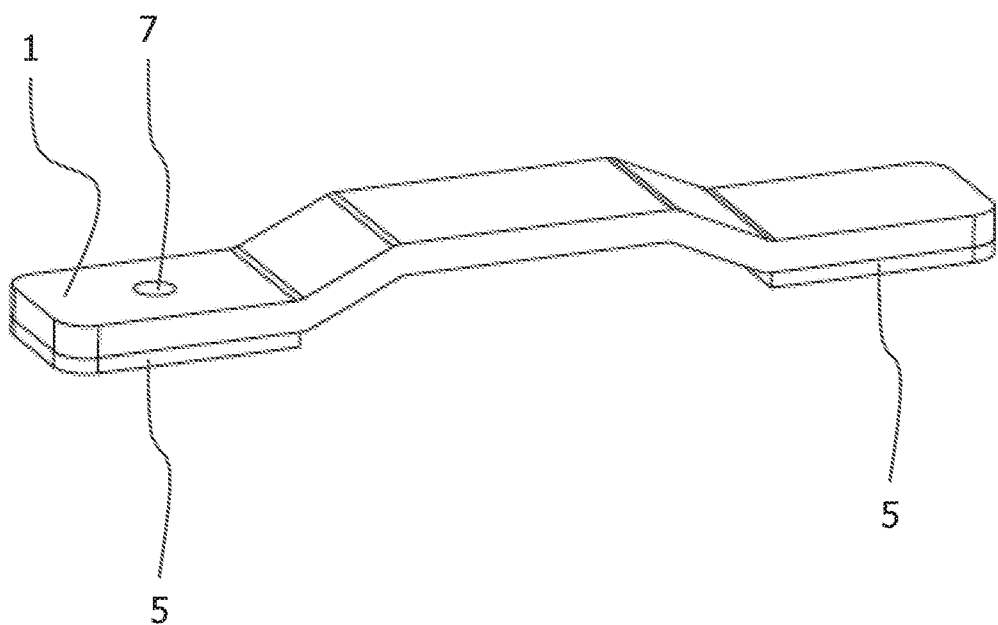
FIG. 2 is a front perspective view of an electrical connection element, showing a recess provided in the surface thereof.
Figure 3:
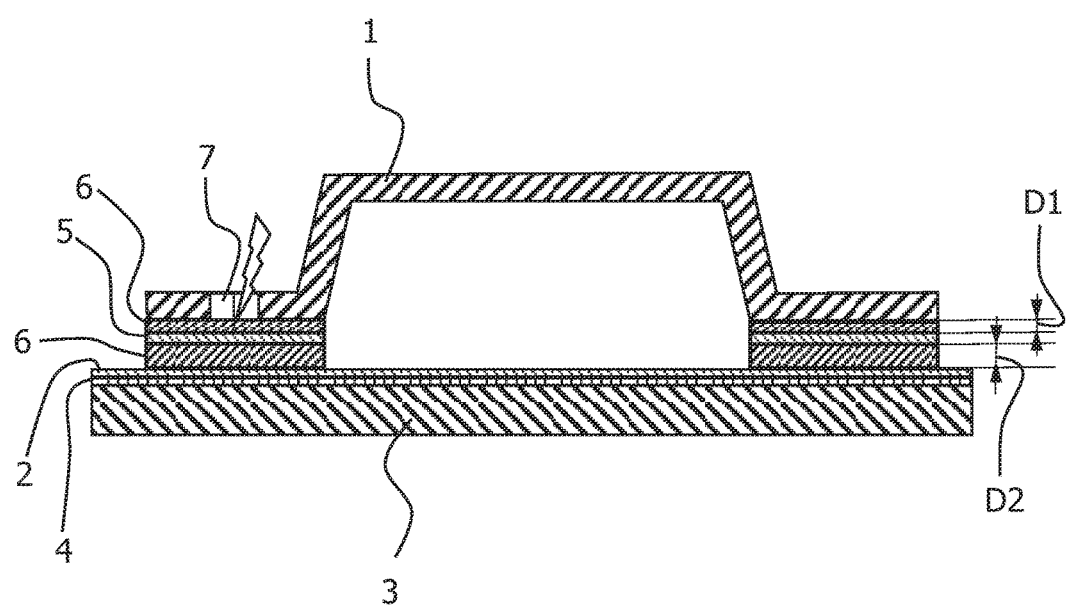
FIG. 3 is a cross-sectional view of an exemplary joint using nanometer multilayer foil, showing solder layers having different thicknesses.
Figure 4:
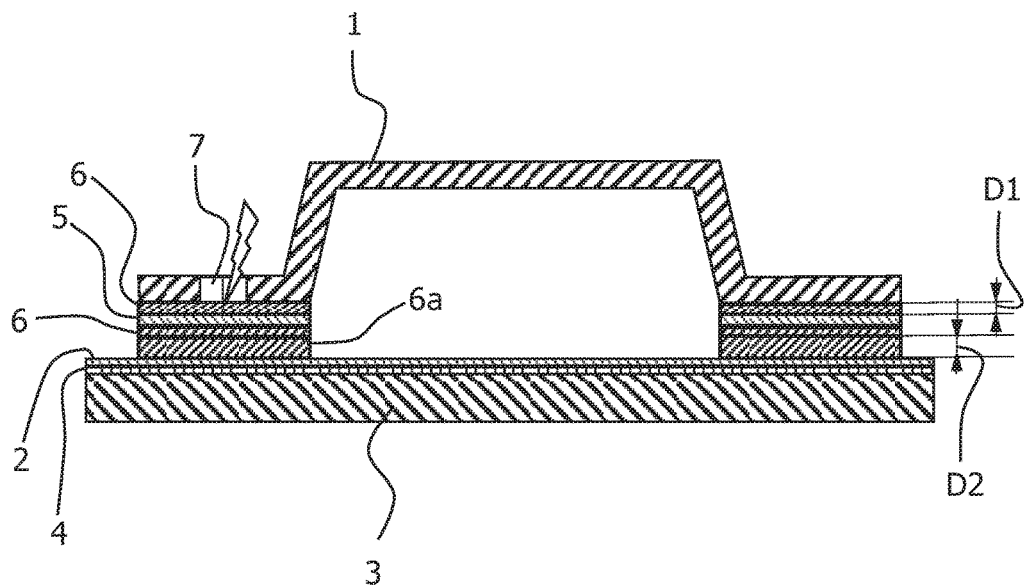
FIG. 4 is a cross-sectional view of an exemplary joint using nanometer multilayer foil, showing an additional solder layer.
Figure 5:
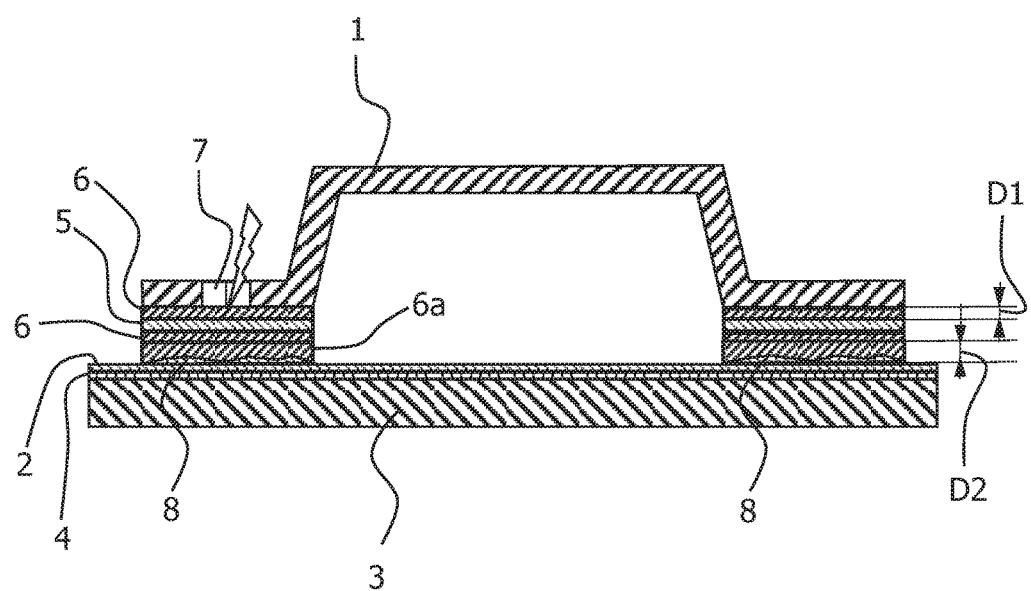
FIG. 5 is a cross-sectional view of an exemplary joint using nanometer multilayer foil, showing the uneven portions thereof.
Figure 6:
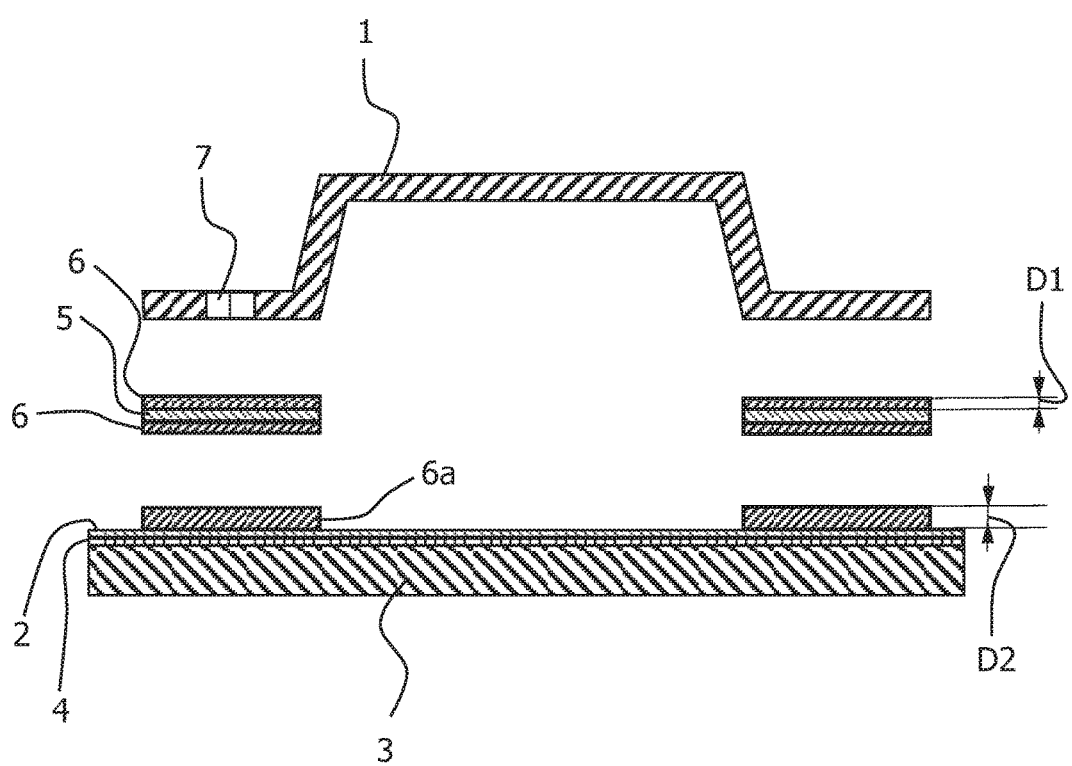
FIG. 6 is an exploded cross-sectional view of the exemplary joint using nanometer multilayer foil shown in FIG. 4.

According to the drawing figures a component, in particular a soldering base made from a metal material, in particular a special alloy is arranged on a printed conductive structure, in particular configured a silver layer 2.

The conductive structure this means the silver layer 2 is arranged on a glass substrate 3.

Between the silver layer 2 and the glass substrate 3 there is a color layer 4.

The surface of the silver layer 2 and the respective bottom side of the soldering base 1 form joining surfaces 2.

A solder coated or non-solder coated reactive nanometer multilayer foil 5 is now arranged as a nano scale multilayer system between the joining surfaces.

When using a solder coated multilayer system 5, amounts of the solder 6 are applied on both surface sides.

When using non solder coated multilayer systems 5 a corresponding solder preform 6 is formed between the joining surfaces with the multilayer system 5 connected there between.

The corresponding multilayer systems 5 are preconfigured with respect to their joining surfaces.

According to an advantageous embodiment the solder preform or an additional solder preform 6a between the nanometer multilayer foil 5 and the conductive structure 2 applied to the glass substrate 3 are configured so that the conductive structure 2 has a greater, in particular at least a double layer thickness compared to another solder preform, thus the preform that is arranged between the solder base 1 and the nanometer multilayer foil 5. Thus, it is assured that no excessively high temperature is introduced into the conductive structure 2. Furthermore the provided solder gap is filled sufficiently so that uneven portions 8 are filled.

After a pressing force P is applied which acts between the joining surfaces an exothermal reaction of the foil is triggered. This is represented in the FIGURE representation by a lightening symbol.

Triggering the exothermal reaction can be done by a laser impulse or an electrical discharge.

According to an advantageous embodiment a recess 7 is provided in the surface of the electrical connection component for introducing the ignition impulse into the nanometer multilayer 5.

In order to introduce the ignition impulse into the nanometer multilayer foil 5 it can protrude beyond at least one side of the joining surfaces according to the figure representations.

By selecting reactive materials systems for producing reactive foils the adiabatic reaction temperature can be selected. Maximum adiabatic temperatures can be in a range of 1600° C. for in Ni/AL reaction systems.

By using reactive nanometer multilayer foils a respective local heat source is created with respect to the respective joining surfaces. As a consequence the introduction of heat energy and stress into adjacent components is minimized since the thermal energy is released directly in the joint gap, this means in the instant embodiment in the solder gap. External heating by an oven through induction or similar is not necessary.

Process efficiency can be increased further in that solder that is necessary for bonding is applied directly to the foil so that an interconnection is created that is easy to use and which forms the solder material and the heat source at the same time.

The invention claimed is:

1. A method for forming a bonded joint between a structure that is applied to a glass substrate and an electrical connecting component by using solder coated or non-solder coated reactive nanometer multilayer foil which is made from at least two exothermally reacting materials, the structure having a first joining surface and the electrical connecting component having a second joining surface, the first joining surface being situated opposite the second joining surface, the first joining surface and the second joining surface together defining opposing joining surfaces, characterized by the steps:

preconfiguring the solder coated or non-solder coated reactive nanometer multilayer foil to fit the opposing joining surfaces of the structure and the electrical connecting component;

arranging a solder preform respectively between the non-solder coated reactive nanometer multilayer foil and at least one of the first joining surface and the second joining surface for non-solder coated foil or arranging an additional solder preform for already solder coated reactive nanometer multilayer foil between the solder coated reactive nanometer multilayer foil and the structure, wherein the solder preform or the additional solder preform includes a larger layer with a greater thickness compared to another solder preform between the solder coated or non-solder coated reactive nanometer multilayer foil and the structure applied to the glass substrate so that a reduction of a temperature introduction into the structure and a leveling of uneven portions is caused;

temporarily applying a pressure force P which is applied between the opposing joining surfaces; and triggering of an exothermal reaction of the solder coated or non-solder coated reactive nanometer multilayer foil, wherein
a recess is provided in a surface of the electrical connection component for introducing an ignition impulse into the solder coated or non-solder coated reactive nanometer multilayer foil.

2. The method according to claim 1, characterized in that the solder coated or non-solder coated reactive nanometer multilayer foil protrudes at least beyond one side of at least one of the first joining surface and the second joining surface for introducing the ignition impulse into the solder coated or non-solder coated reactive nanometer multilayer foil.

3. The method according to claim 1, characterized in that a total thickness of the solder coated or non-solder coated reactive nanometer multilayer foil is sized as a function of properties of the structure and a base of the structure with respect to a thermal energy that is to be released.

4. The method according to claim 1, characterized in that at least a portion or components of the solder coated or non-solder coated reactive nanometer multilayer foil are directly applied to at least one of the first joining surface and the second joining surface.

5. The method of claim 1, characterized in that the electrical connecting component is a solder base.

6. The method of claim 1, characterized in that the structure is a printed conductive structure.

7. The method of claim 1, characterized in that the larger layer with the greater thickness is a layer with a double thickness.

8. The method of claim 4, characterized in that the at least one portion or components of the solder coated or non-solder coated reactive nanometer multilayer foil are deposited on at least one of the first joining surface and the second joining surface.

* * * * *